United States Patent
Sakugawa et al.

(10) Patent No.: US 6,272,583 B1
(45) Date of Patent: Aug. 7, 2001

(54) MICROPROCESSOR HAVING BUILT-IN DRAM AND INTERNAL DATA TRANSFER PATHS WIDER AND FASTER THAN INDEPENDENT EXTERNAL TRANSFER PATHS

(75) Inventors: Mamoru Sakugawa; Hiroyuki Kondo; Naoto Okumura, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/053,698

(22) Filed: Apr. 2, 1998

(30) Foreign Application Priority Data

Dec. 26, 1997 (JP) .................................................... 9-361306

(51) Int. Cl.[7] .................................................... G06F 13/14
(52) U.S. Cl. .............................. 710/130; 710/127; 710/53
(58) Field of Search .................................... 711/147, 150, 711/153; 710/126, 127, 128, 129, 130, 52, 53

(56) References Cited

U.S. PATENT DOCUMENTS

| | | | |
|---|---|---|---|
| 5,003,463 | 3/1991 | Coyle et al. | 710/57 |
| 5,590,286 | * 12/1996 | Mehring et al. | |
| 5,640,399 | * 6/1997 | Rostoker et al. | |
| 5,664,122 | * 9/1997 | Rabe et al. | |
| 5,784,076 | * 7/1998 | Crump et al. | |
| 5,809,259 | * 9/1998 | Mitsuishi | |
| 5,881,248 | * 3/1999 | Mergard | |

FOREIGN PATENT DOCUMENTS

| | | |
|---|---|---|
| 2-33646 | 2/1990 | (JP) . |
| 2-133853 | 5/1990 | (JP) . |
| 3-240151 | 10/1991 | (JP) . |
| 5-46535 | 2/1993 | (JP) . |
| 7-253872 | 10/1995 | (JP) . |

OTHER PUBLICATIONS

Patterson and Hennessy, "Computer Organization and Design", Morgan Kaufmann Publishers, 1994, pp. 481–484.*

* cited by examiner

Primary Examiner—Do Hyun Yoo
Assistant Examiner—Gary J. Portka
(74) Attorney, Agent, or Firm—Burns, Doane, Swecker & Mathis, LLP

(57) ABSTRACT

A microprocessor having a built-in DRAM performs following processes: data stored in the buffer 14a is transferred to the DRAM 16 through the internal bus 15 whose data transfer speed is higher than that of the system bus 13a, the transferring occurring when the number of data input operations by the bus interface unit 14 reaches a predetermined number "p", and an operation result obtained by execution of the CPU 17 and then stored in the DRAM 16 is read through the internal bus 15 and then output to the system bus 13b.

17 Claims, 7 Drawing Sheets

MICROPROCESSOR HAVING BUILT-IN DRAM AND INTERNAL DATA TRANSFER PATHS WIDER AND FASTER THAN INDEPENDENT EXTERNAL TRANSFER PATHS

BACKGROUND OF THE INVENTION

1. Field of the Invention

The present invention relates to a microprocessor having a built-in Dynamic Random Access Memory (DRAM) and a data transfer method thereof to be used in systems for processing a large number of data items such as image processing systems.

2. Description of the Prior Art

FIG. 12 is a diagram showing a configuration of a conventional microprocessor having a built-in DRAM. In FIG. 12, the reference number 1 designates a camera to photograph images, 2 denotes an image input section for inputting image data photographed through the camera 1 and then for performing as a master of a system bus 3 and for outputting an access signal to a built-in DRAM 4. The reference number 3 indicates the system bus having a plurality of lines, and 4 designates the DRAM connected to the system bus 3. The reference number 8 designates a bus interface unit capable of receiving image data transferred from the image input section 2 and capable of transferring the image data to the DRAM 4 through the system bus 3, and capable of transferring operation results stored in the DRAM 4 to an image output section 6 through the system bus 3 when receiving an interrupt signal transferred from the image input section 2. The reference number 6 denotes the image output section capable of outputting the operation results stored in the DRAM 4 and obtained by the execution of a central processing unit (CPU) 5, 7 indicates a display device for displaying image data as the operation results transferred from the image output section 6. The reference number 5 designates the CPU for performing image processing on the data items stored in the DRAM 4 that have been transferred from the image input section 2 and for transferring the operation result of the image processing to the DRAM 4.

Next, a description will be given of the operation of the conventional microprocessor having a built-in DRAM shown in FIG.12.

First, when the camera 1 photographs an image, the image input section 2 receives the image data photographed by the camera 1 and then transfers a transfer request to the bus interface unit 8. This transfer request is the request to transfer the image data to the DRAM 4.

When receiving the transfer request sent from the image input section 2, the bus interface unit 8 transfers the image data obtained by the image input section 2 to the DRAM 4 through the system bus 3.

In this conventional case, because the size of the image data is a larger size, it is required for the bus interface unit 8 to perform the data transfer operation many times in order to completely output the image data items to the DRAM 4. For example, when the system bus 3 has the function to output a 32 bit data item to the DRAM 4 at a time, the data transfer operation must be repeated several times until the image data items are transferred completely to the DRAM 4. The number of the repeat times of the data transfer operation to the DRAM 4 may be calculated by dividing the size of the image data items by thirty two (32).

The CPU 5 performs the image processing operation by using the image data stored in the DRAM 4 and then transfers the operation result to the DRAM 4. The DRAM 4 stores the operation result transferred from the CPU 5.

When receiving the data transfer request, sent from the image output section 6, to transfer the operation result stored in the DRAM 4, the bus interface unit 8 transfers the operation result from the DRAM 4 to the image output section 6 through the system bus 3.

After this operation, the image output section 6 transfers the operation result to the display device 7. The display device 7 then displays the received operation result to operators.

Because the conventional microprocessor having a built-in DRAM has the configuration described above, when an user requests to increase the entire operation speed of a system including the conventional microprocessor having a built-in DRAM under the condition in which a large size of image data is processed, it is difficult to increase the entire operation speed of the system even if the through-put of the CPU 5 may be increased because the system bus 3 is repeatedly used for both the data transfer from the image input section 2 to the DRAM 4 and the data transfer from the DRAM 4 to the image output section 6, that is, because the frequency of use of the system bus 3 is increased. This becomes a bottle-neck for the entire processing speed of the system. In addition to this drawback, because there is a drawback that the system bus 3 has the limitation of the data transfer speed, it is difficult to increase the data transfer speed of the system according to a request. As a result, it is difficult to increase the processing speed of the entire system.

SUMMARY OF THE INVENTION

Accordingly, an object of the present invention is, with due consideration to the drawbacks of the conventional microprocessor having a built-in DRAM, to provide a microprocessor having a built-in DRAM and a data transfer method thereof, both are capable of increasing the entire operation speed of a system device incorporating this microprocessor having a built-in DRAM even if data of a larger size must be processed.

In accordance with a preferred embodiment of the present invention, a microprocessor having a built-in dynamic random access memory (DRAM) comprises input means for inputting data through an external data transfer path and storing said data into a first buffer, transfer means for transferring said data stored in said first buffer to said DRAM through an internal data transfer path, whose data transfer speed is higher and whose data width is wider than a data transfer speed and a data width of said external data transfer path, when the number of data input operations performed by said input means reaches a predetermined number not less than two and when said first buffer is filled with said data, and output means for reading said data stored in said DRAM through said internal data transfer path, for writing said data into a second buffer, and for outputting said data in said second buffer to an external data transfer path. In the microprocessor described above, said external data transfer path connected to each of said first buffer and said second buffer operates independently to each other.

In accordance with another preferred embodiment of the present invention, a microprocessor having a built-in dynamic random access memory (DRAM) comprises input means for inputting data through an external data transfer path and storing said data into a first buffer, transfer means for transferring said data stored in said first buffer to said DRAM through an internal data transfer path, whose data transfer speed is higher and whose data width is wider than a data transfer speed and a data width of said external data transfer path, said transferring occurring when the number of data input operations performed by said input means reaches a predetermined number not less than two and when said first buffer is filled with said data, processing means for processing said data stored in said DRAM and for storing an operation result into said DRAM, and output means for reading said operation result stored in said DRAM through said internal data transfer path, for writing said operation result into a second buffer, and for outputting said operation result stored in said second buffer to an external data transfer path. In the microprocessor described above, said external data transfer path connected to each of said first buffer and said second buffer operates independently to each other.

In the microprocessor having a built-in DRAM as another preferred embodiment of the present invention, said internal data transfer path has a double size or more of a bus width than a bus width of said external data transfer path.

In the microprocessor having a built-in DRAM as another preferred embodiment of the present invention, a data storing size of said buffer to which said input means stores said data is equal to or an integer multiple of a data size that is transferred at a time through said internal data transfer path.

In the microprocessor having a built-in DRAM as another preferred embodiment of the present invention, said output means performs a data accessing based on a page access mode to access data on a per page basis when said output means reads said data stored in said DRAM and outputs said data to said external data transfer path.

In the microprocessor having a built-in DRAM as another preferred embodiment of the present invention, said output means performs a data accessing based on a page access mode to access data on a per page basis when said output means reads said data stored in said DRAM and outputs said data to said external data transfer path.

In the microprocessor having a built-in DRAM as another preferred embodiment of the present invention, said output means reads said data stored in said DRAM, converting said data into serial data items, and outputs said serial data items serially to said external data transfer path.

In the microprocessor having a built-in DRAM as another preferred embodiment of the present invention, said data transfer means also transfers said data to said output means directly when said data transfer means transfers said same data to said DRAM.

In the microprocessor having a built-in DRAM as another preferred embodiment of the present invention, a memory area of said DRAM is divided into a bank region into which said data transfer means stores said data and a bank region into which said CPU stores operation result.

In accordance with another preferred embodiment of the present invention, a data transfer method of a microprocessor having a built-in dynamic random access memory (DRAM), which comprises the steps of inputting data through an external data transfer path, storing said data into a first buffer, transferring said data stored in said first buffer to said DRAM through an internal bus whose data transfer speed is higher than a data transfer speed of said external data transfer path, said transferring occurring when the number of data input operations through said external data transfer path is reached to a predetermined number not less than two, reading said data stored in said DRAM through said internal data transfer path, and outputting said data to an external data transfer path through a second buffer. In the method described above, said external data transfer path connected to each of said first buffer and said second buffer operates independently to each other.

The data transfer method of a microprocessor having a built-in DRAM as another preferred embodiment of the present invention, further comprises the steps of processing said data stored in said DRAM, storing an operation result of said processing into said DRAM, reading said operation result stored in said DRAM through said internal data transfer path, and outputting said operation result to said external data transfer path.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

Preferred embodiments of the microprocessor having a built-in DRAM according to the present invention will now be described with reference to the drawings.

First Embodiment

Figure 1:
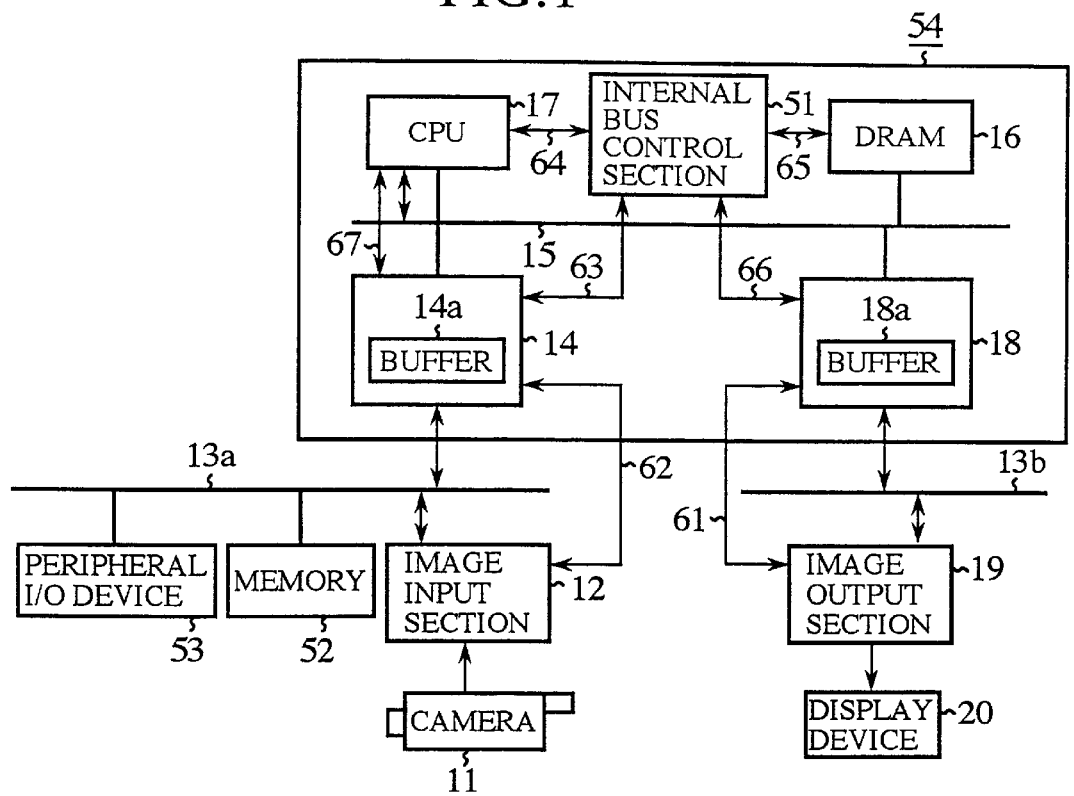
FIG. 1 is a diagram showing a configuration of a microprocessor having a built-in DRAM according to the first embodiment of the present invention.

FIG. 1 is a diagram showing the configuration of the microprocessor having a built-in DRAM according to the first embodiment of the present invention.

In FIG. 1, the reference number 11 designates a camera to photograph data such as various images, 12 denotes an image input section for inputting data such as the image data photographed by the camera 11 and then for transferring the image data to the built-in dynamic random access memory (DRAM) 16 in order to perform image processing operation for the data such as the image data by a central processing unit (CPU) 17. The reference characters 13a and 13b designate system buses (external transfer paths) having a plurality of lines. The system bus 13a is connected to a bus interface unit 14 through which the image input section 12 may perform the above operation. The reference number 14 denotes a bus interface unit (as input means) capable of inputting data such as the image data transferred from the image input section 12 when receiving a data transfer request transferred from the image input section 12, and capable of transferring data through the system bus 13a in order to perform various access operations such as an instruction read operation and an operand access operation to an external memory 52 and a peripheral input/output (I/O) device 53 to be executed by the CPU 17. The reference character 14a indicates a buffer whose memory size is the maximum n×p bits (where n, p are natural numbers) wherein the bus interface unit 14 may input data at a maximum n bits at a time. The reference number 54 designates the microprocessor having the built-in DRAM 16 as the first embodiment.

The reference number 15 designates an internal bus (as an internal transfer path) having a plurality of lines. The speed of data transfer of the internal bus 15 is higher than that of both the system bus 13a and 13b. For example, the internal bus 15 has a wide bus width and may perform under a higher operation frequency. The reference number 16 designates the DRAM connected to the internal bus 15 to be accessed by the CPU 17, the bus interface units 14 and 18. The reference number 17 denotes the CPU (as transfer means, processing means, and output means) to access the DRAM 16 through the internal bus control section 51 when the DRAM 16 stores instructions and data and to transfer requests to the bus interface unit 14 when it wants to access the peripheral I/O device 53 and the external memory 52. The reference number 18 designates a bus interface unit (as output means) for accessing the DRAM 16 in order to read data when receiving a request transferred from the image output section 19 and for storing the data from the DRAM 16 and then for outputting the data to the image output section 19 through the system bus 13b. The reference character 18a designates a buffer whose memory size is the maximum n×p bits (where n, p are natural numbers) wherein the bus interface unit 18 may input data at a maximum of n bits at a time. The reference number 54 designates the microprocessor having the built-in DRAM 16 as the first embodiment. The reference number 19 designates the image output section for outputting a request to the bus interface unit 18 in order to input data stored in the DRAM 16 that has been processed by the CPU 17, for receiving the data from the bus interface unit 18 through the system bus 13b, and for outputting the received data to the display device 20. The reference number 20 denotes the display device to display the data transferred from the image output section 19. The reference character 13b designates the system bus (as an external data transfer path) through which bus interface unit 18 is connected to the image output section 19.

The reference number 51 designates an internal bus control section having the function capable of generating a control signal in order to access the DRAM 16 and the function capable of arbitrating between both requests transferred from the bus interface units 14 and 18 and the CPU 17. The reference number 52 denotes the external memory, 53 indicates the peripheral device to be accessed by the CPU 17, and the reference number 54 designates the microprocessor having the built-in DRAM 16. The reference number 61 indicates interface signals to be used for transferring image data from the bus interface unit 18 to the image output section 19. The interface signals 61 include a transfer permission signal and a read/write signal, and the like. The reference number 62 denotes interface signals to be used for transferring data from the image input section 12 to the bus interface unit 14. The interface signals 62 include a transfer permission signal and a read/write signal, and the like. The reference number 63 indicates interface signals to be used for transferring data from the bus interface unit 14 to the DRAM 16 through the internal bus 15. The interface signals 63 also include a transfer permission signal and a read/write signal, and the like. The reference number 64 designates interface signals to be used for accessing the DRAM 16 by the CPU 17. The interface signals 64 also include a transfer permission signal and a read/write signal, and the like. The reference number 65 denotes a DRAM control signal output from the internal bus control section 51 in order to arbitrate between both requests transferred from the bus interface units 14 and 18 and the CPU 17. The reference number 66 designates interface signals to be used for transferring data from the DRAM 16 to the bus interface unit 18 through the internal bus 15. The interface signals 66 also include a transfer permission signal and a read/write signal, and the like.

Figure 2:
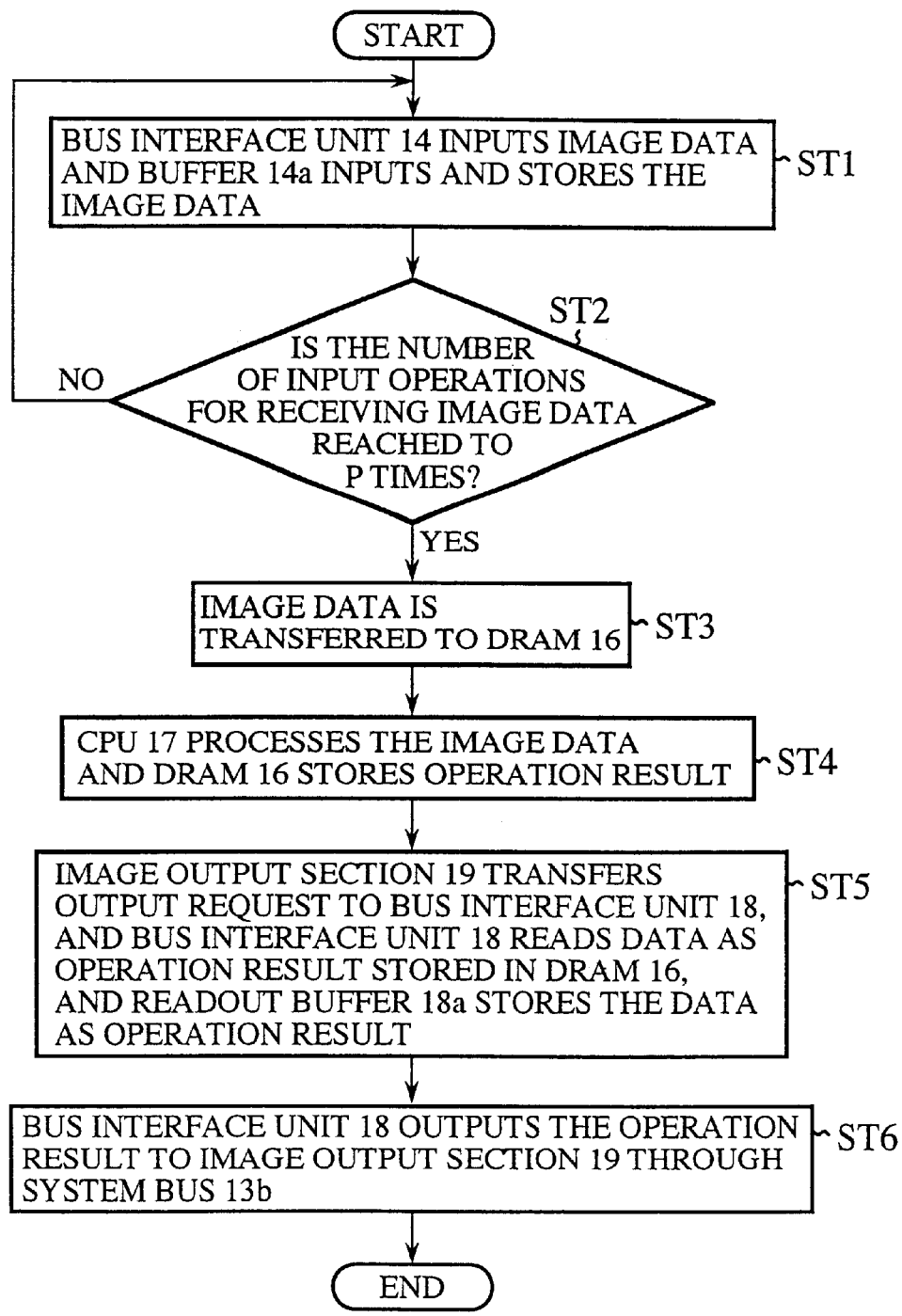
FIG. 2 is a flow chart showing a data transfer method in the microprocessor having a built-in DRAM as the first embodiment of the present invention.

FIG. 2 is a flow chart showing a data transfer method in the microprocessor having the built-in DRAM 16 as the first embodiment of the present invention.

Next, a description will be given of the operation of the data transfer method in the microprocessor having the built-in DRAM shown in FIG. 1 with reference to FIG. 2.

First, the camera 11 photographs images, the image input section 12 inputs the image data that has been photographed by the camera 11 and then outputs a data transfer request to the bus interface unit 14. When the bus interface unit 14 receives this data transfer request, the image input section 12 outputs the image data onto the system bus 13a. After this processing, the bus interface unit 14 inputs the image data through the system bus 13a and stores the received image data into the buffer 14a. The bus interface unit 14a outputs the image data stored in the buffer 14a temporarily to the DRAM 16 (see the Step ST2 and the Step ST3) when the number of the data input times from the image input section 12 becomes not less than p times ("p" is a natural number and not less than two, namely, p≧2) and when the buffer 14a is filled with the image data (this state means the buffer 14a cannot store a new data item any more).

Thus, the image data is transferred from the bus interface unit 14 to the DRAM 16, because the speed the data transfer of the internal bus 15 may be increased easily by expanding the bus width when comparing with the system bus 13a. (On the contrary, it is difficult to expand the ability of data transfer of the system bus 13a in cost and power consumption). That is, the internal bus 15 has the bus width that is m times (m≧2) of the bus width of the system bus 13a. In addition, the internal bus 15 may perform under an operation frequency that is n times (n≧2) of the operation frequency of the system bus 13a.

Thereby, the speed of the data transfer of the internal bus 15 becomes m times that of the system bus 13a, so that the frequency of accessing between the bus interface unit 14 and the DRAM 16 may be decreased to 1/m times of the bus width of the system bus 15 as compared with a conventional one. This causes an increase in an idling time period of the DRAM 16. Specifically, when the maximum bits of data to be transferred at a time is 32 bits, for example, and when m=8, the speed of the data transfer of the internal bus 15 becomes 8 times of that of the external bus 13a because the internal bus 15 may transfer data of 256 bits (=32×8) at a time. This causes to decrease the frequency of the accessing between the bus interface unit 14 and the DRAM 16 when compared with the conventional one.

Then, the CPU 17 performs the image processing for the data such as image data that have been stored in the DRAM 16 and then stores the operation result into the DRAM 16. According to the data transfer request sent from the image output section 19, the bus interface unit 18 accesses the DRAM 16 and then transfers the operation result to the buffer 18a and outputs it into the system bus 13b (see the Step ST5). In the explanation of the microprocessor 54 having the built-in DRAM 16 described above, the CPU 17 performs the image processing on the data stored in the DRAM 16, but the present invention is not limited by this. For example, it is possible for the CPU 17 to perform processing operations other than the image processing, or it is also possible for the CPU 17 to perform no operation.

After this, the operation result obtained by the execution of the CPU 17 stored in the DRAM 16 is transferred and temporarily stored in the buffer 18a under the control of the bus interface unit 18 according to the transfer request of the image output section 19. Then, the operation result is sequentially output to the image output section 19 through the system bus 13b (see the Step ST6). That is, because the speed of the data transfer of the system bus 13b is lower than that of the internal bus 15 and it is difficult to output the operation result stored in the buffer 18a at one time onto the system bus 13b, the operation result is divided into several parts in order to transfer it onto the system bus 13b. For example, when the operation result is a 256 bit data item, this operation result is divided into eight-parts (each part contains a 32 bit data item) and then transferred onto the system bus 13b eights times (M=8). After the data transfer operation to the system bus 13b for the operation result obtained by the execution of the CPU 17 is completed, the image output section 19 outputs the operation result to the display device 20. Thereby, the display device 20 displays the operation result to operators.

As described above, according to the microprocessor having the built-in DRAM of the first embodiment, when the number of the data input operations performed by the bus interface unit 14 is reached to a predetermined frequency "p" (p is a natural number), the data stored in the buffer 14a is transferred to the DRAM 16 through the internal bus 15 whose data transfer speed is higher than that of the system bus 13a. In addition to this operation, the operation result obtained by the execution of the CPU 17 stored in the DRAM 16 is read through the internal bus 15 and then transferred to the system bus 13b. Because the microprocessor having the built-in DRAM of the first embodiment has the above configuration, it is possible to avoid a case where the data transfer operation becomes a bottle neck for the entire processing speed even if data items of a larger size such as image data are processed. As a result, it is possible to increase the entire operation speed of a system incorporating the microprocessor having the built-in DRAM as the first embodiment.

Second Embodiment

In the preceding explanation for the microprocessor having a built-in DRAM of the first embodiment, as shown both FIG. 1 and FIG. 2, it is not described to limit the relationship between the data storing size of the buffer 14a and the bus width of the internal bus 15.

In the second embodiment of the microprocessor having a built-in DRAM, it is easily possible to manage the data processing by the bus interface unit 14 and to manage the data transfer by the CPU 17 when the data storing size of the buffer 14a and the bus width of the internal bus 15 is set so that the data input frequency "p" for the image data transferred from the image input section 12 through the system bus 13a has the relationship of P=m (as has been described, "m" means the bus width of the internal bus 15. This bus width "m" is the bus width of m-times of the bus width of the system bus 13a).

Third Embodiment

In the explanation for the microprocessor having a built-in DRAM as the first embodiment, as shown both FIG. 1 and FIG. 2, it has been described that the bus interface unit 14 outputs the request of the data transfer to the CPU 17 and the data is then transferred to the bus interface unit 18 under the control of the CPU 17. The present invention is not limited by this, for example, it is possible for the CPU 17 to transfer data items based on the execution of an instruction fetch, the execution of an operand access, and a request transferred from a system bus master (omitted from the drawings). This processing of the microprocessor as the third embodiment may also obtain the same effect of the microprocessor having built-in DRAM as the first embodiment.

Fourth Embodiment

Figure 3:
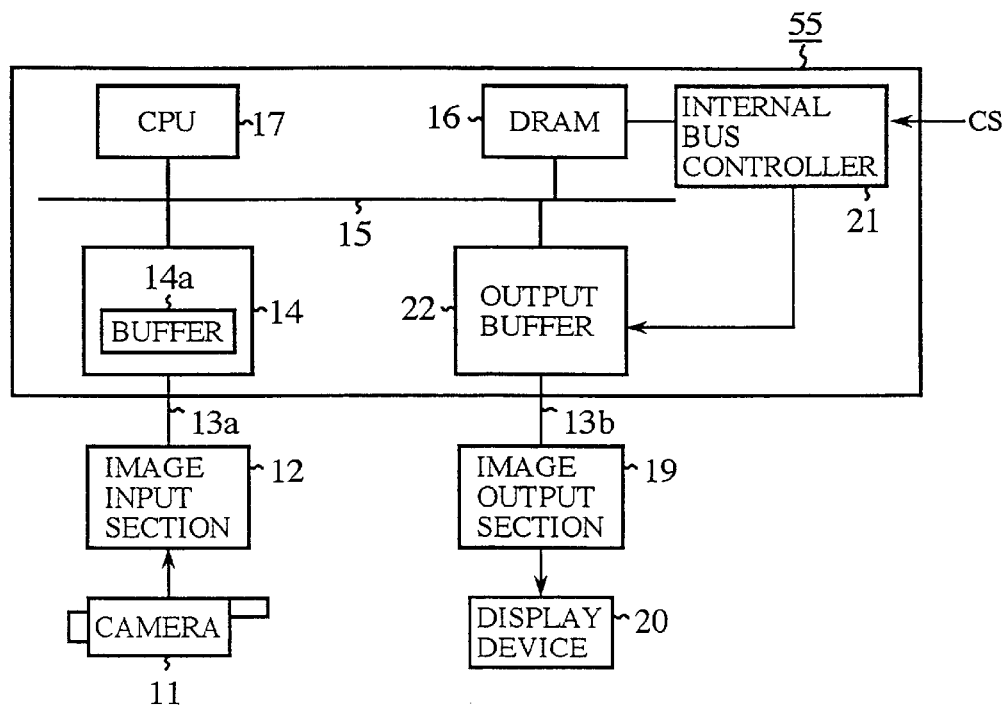
FIG. 3 is a diagram showing a configuration of a microprocessor having a built-in DRAM according to the fourth embodiment of the present invention.
Figure 4:
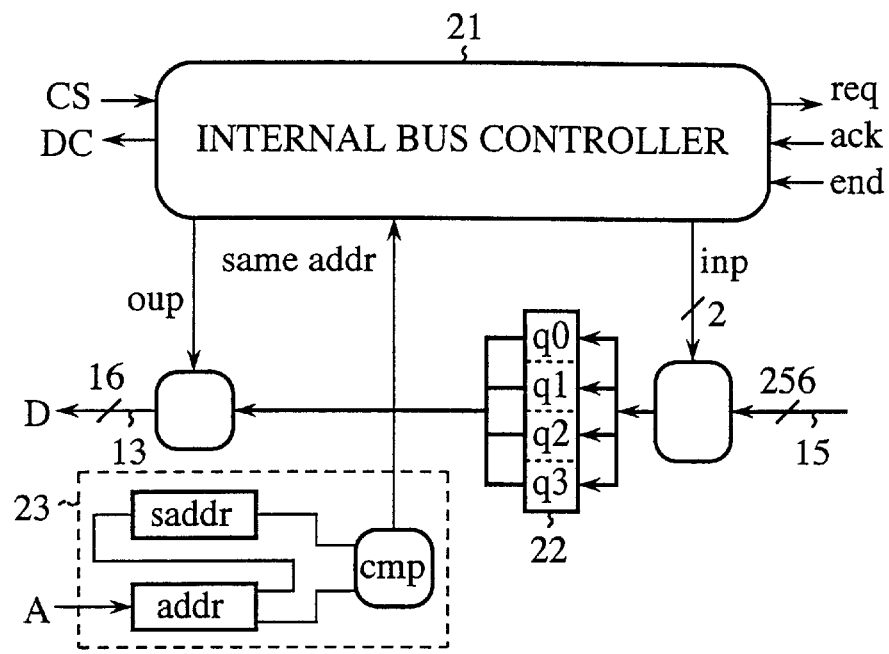
FIG. 4 is a diagram showing a detailed configuration of a peripheral section of an internal bus controller.

FIG. 3 is a diagram showing a configuration of the microprocessor having a built-in DRAM according to the fourth embodiment of the present invention. FIG. 4 is a diagram showing a detailed configuration of a peripheral section of an internal bus controller incorporated in the microprocessor having a built-in DRAM shown in FIG. 3. In FIG. 3, the reference number 55 designates the microprocessor having the built-in DRAM 16, and 21 denotes the internal bus controller (as output means).

When receiving a chip select signal CS transferred from external device (omitted from the diagrams), the internal bus controller 21 performs a burst read operation for the operation result stored in the DRAM 16 and transfers this operation result to queues q0 to q3 in an output buffer 22 through the internal bus 15. The reference number 22 indicates the output buffer (as output means) having a plurality of the queues (q0 to q3) 22 to transfer the operation result obtained by the execution of the CPU 17 to the system bus 13a under the control of the internal bus controller 21. Those queues q0 to q3 are shown in FIG. 4. The reference number 23 indicates a comparator to compare address values. The same circuit components are designated with the same reference numbers of the circuit components used in the microprocessor of the first embodiment, and the explanation of them is therefore omitted here for brevity.

Next, a description will be given of the operation of the microprocessor 55 having the built-in DRAM 16 shown in FIGS. 3 and 4.

The preceding explanation for the microprocessor having the built-in DRAM 16 of the first embodiment, as shown both FIG. 1 and FIG. 2, has not described the accessing method to the DRAM 16 when the CPU 17 transfers the data stored in the DRAM 16 to the bus interface unit 18. In the preceding case, during a normal operation, when data of a large size not less than a data that the CPU 17 can access at one time is stored in the DRAM 16, it is required to designate addresses of the data to be transferred for every read access of the data transfer to the DRAM 16 by the CPU 17.

On the contrary, the microprocessor having the built-in DRAM 16 as the fourth embodiment has the function in which it is not required to designate any following addresses of the data to be transferred stored in the DRAM 16 after a first address of the data stored in the DRAM 16 is designated because the microprocessor 55 of the fourth embodiment has the function of data transfer in a page mode in which data to be transferred is accessed on the basis of page size. This processing may achieve an increase in data transfer speed.

The operation of the microprocessor 55 having the built-in DRAM 16 as the fourth embodiment will be explained under the condition in which the bus width as the ability of each of the system buses 13a and 13b is a 16 bit bus width, the bus width as the ability of the internal bus 15 is a 256 bit bus width, the data of a plurality of pages is stored in the DRAM 16, and one page includes the data of 1024 bits.

Figure 5:
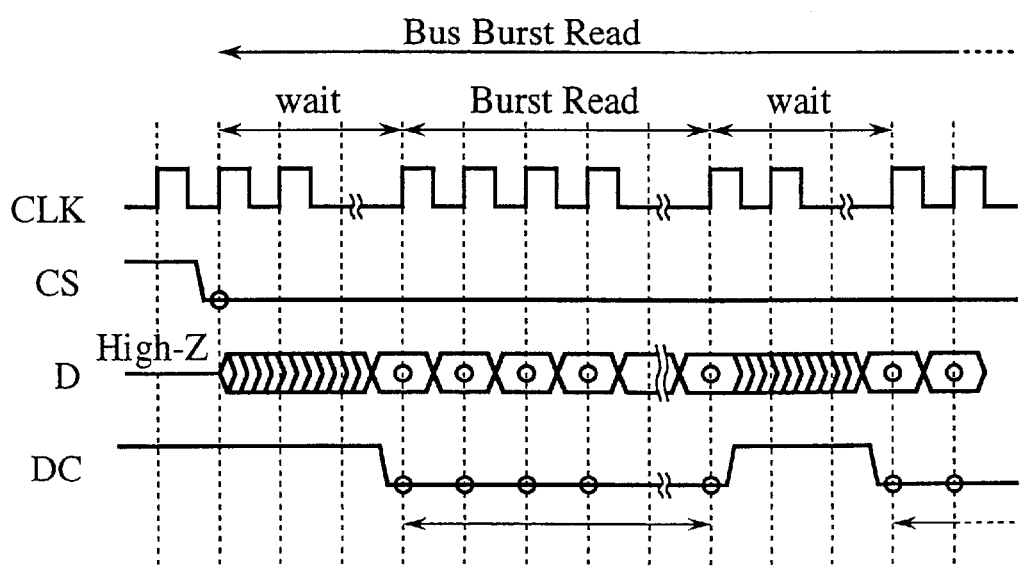
FIG. 5 is a diagram showing waveforms of a data transfer executed by the microprocessor having a built-in DRAM of the fourth embodiment shown in FIG. 3.

First, when receiving a chip select signal CS and an address of the data stored in the DRAM 16 in synchronism with a clock signal, the internal bus controller 21 performs a burst read operation for one page of data (namely, data of 1024 bits) including the address sampled when the chip select signal CS is asserted, as shown in FIG. 5. Then, the internal bus controller 21 transfers the obtained data into the queues q0 to q3 in the output buffer 22 through the internal bus 15.

After transferring the obtained data to the queues q0 to q3 in the output buffer 22, the internal bus controller 21 indicates an instruction-to the output buffer 22 so that the data in the queues q0 to q3 is output every 16 bits to the image output section 19. In this case, the internal bus controller checks whether both the data of every 16 bits to be transferred to the image output section 19 and the data stored in the queues q0 to q3 are the data in the same page or not by using the comparator 23. When both the data are not in the same page, the internal bus controller 21 deletes all of the data stored in the queues q0 to q3 and reads the data of one page from the DRAM 16 again and then performs the same operation described above.

FIG. 5 is a diagram showing waveforms of the data transfer operation executed by the microprocessor having a built-in DRAM of the fourth embodiment shown in FIG. 3. When the internal bus controller 21 reads the data from the DRAM 16 again, as shown in FIG. 5, a data transfer cycle DC is set to the high "H" level, namely, the data transfer cycle DC enters a data transfer waiting state. When the queues q0 to q3 are filled with the data transferred from the DRAM 16, the internal bus controller 21 transfers the data stored in the queues q0 to q3 to the system bus 13b.

As described above, according to the microprocessor having the built-in DRAM of the fourth embodiment, because the data may be transferred in the burst data transfer to the image output section 19 when the data stored in the DRAM 16 is read and transferred onto the system bus 13b, it is possible to perform the data transfer operation at a high speed rate even if data such as image data of a large data size is processed.

Fifth Embodiment

The preceding description for the microprocessor having a built-in DRAM of the fourth embodiment has explained the case in which only the first address of data to be transferred is designated when the data transfer operation is initiated.

Figure 6:
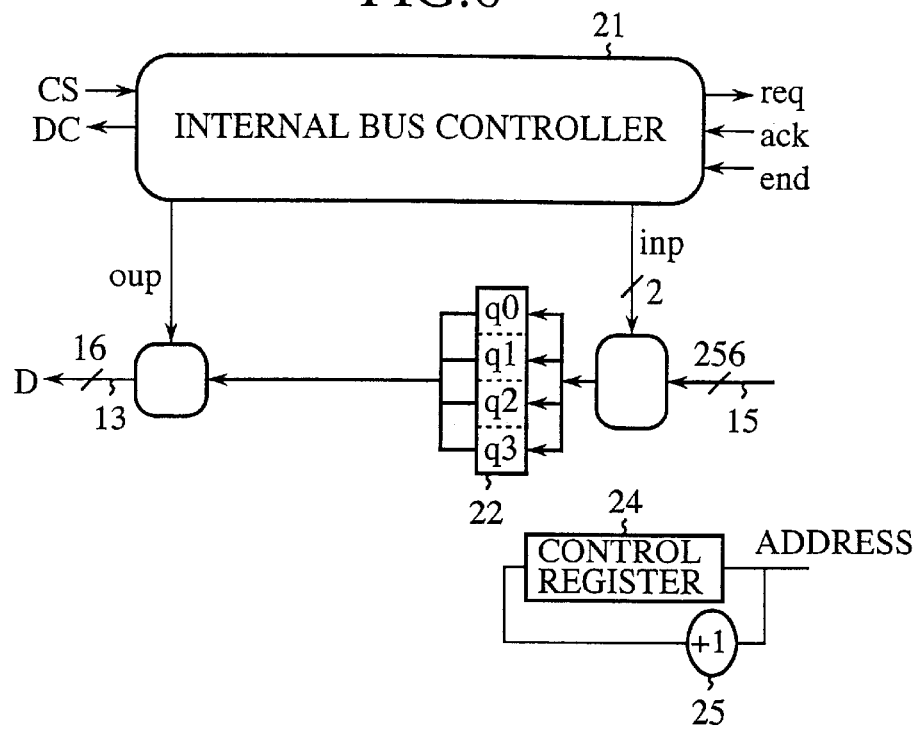
FIG. 6 is a diagram showing a detailed configuration of a peripheral section of the internal bus controller.

FIG. 6 is a diagram showing a detailed configuration of a peripheral section of the internal bus controller 21 in the microprocessor having a built-in DRAM of the fifth embodiment.

As shown in FIG. 6, it is possible to designate the address (as the first address) of data to be transferred by using the value stored in the control register 24 and to generate following addresses of the data by incrementing the value stored in the register 24 by an incrementer 25 when all of the queues q0 to q3 become empty. Thus, according to the microprocessor having the built-in DRAM 16 as the fifth embodiment of the present invention, it is possible to increase the data transfer speed, like the microprocessor having the built-in DRAM 16 as the fourth embodiment, and it is further possible to reduce the number of I/O terminals of the microprocessor through which address data items are inputted.

Sixth Embodiment

In the microprocessors having a built-in DRAM as the first to fifth embodiments described above, data is transferred to the image output section 19 through the system bus 13a including a plurality of signal lines formed in parallel under the control of the bus interface unit 18 or under the control of the output buffer 22.

Figure 7:
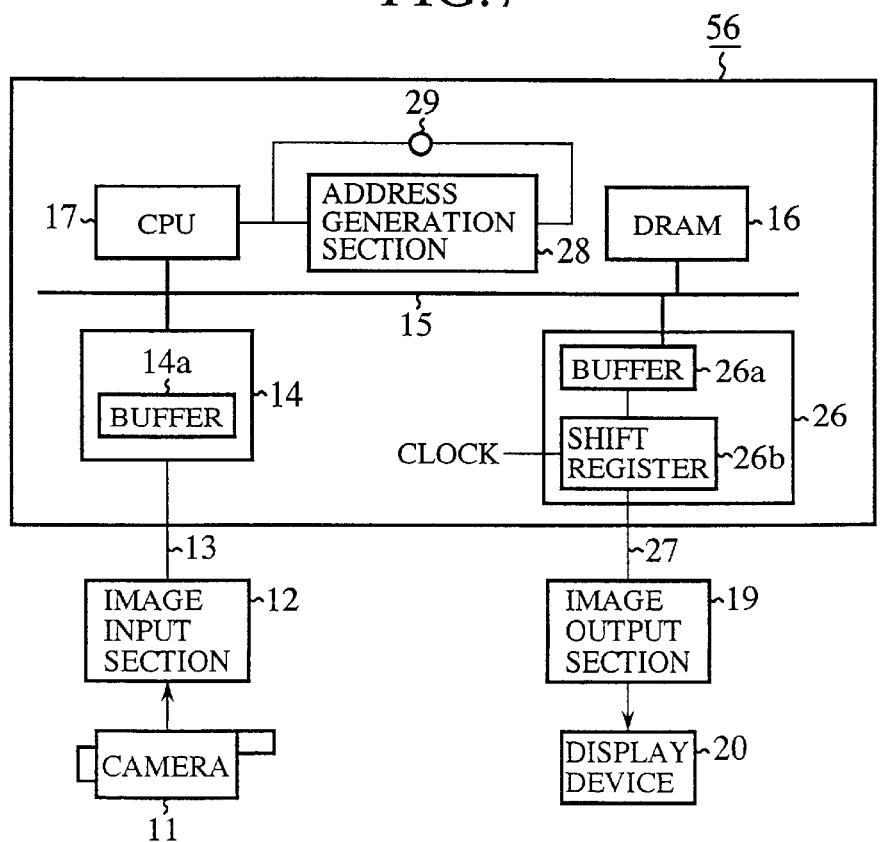
FIG. 7 is a diagram showing a configuration of a microprocessor having a built-in DRAM according to the sixth embodiment of the present invention.

FIG. 7 is a diagram showing a configuration of the microprocessor having a built-in DRAM according to the sixth embodiment of the present invention. In FIG. 7, the reference number 56 designates the microprocessor having a built-in DRAM as the sixth embodiment, 28 denotes an address generation section for generating an address to be used for accessing the data stored in the DRAM 16. The reference number 29 indicates an incrementer for incrementing the value of the address generated by the address generation section 28. The reference number 26 designates a serial output section and 26a indicates a buffer and 26b denotes a shift register operable in synchronism with a clock signal.

In the microprocessor having a built-in DRAM of the sixth embodiment of the present invention, it is possible to perform the following data transfer operation. That is, the data to be transferred to the image output section 19, stored in the DRAM 16, is transferred to the buffer 26a and temporarily stored in the buffer 26a in the serial output section 26, and each bit in the data is sent to the image output section 19 every one bit through a serial signal line (as an external data transfer path) 27 in synchronism with the clock signal.

As described above, according to the microprocessor having a built-in DRAM of the sixth embodiment, it is possible to further reduce the number of input/output (I/O) terminals of the microprocessor having a built-in DRAM rather than the number of I/O terminals in the microprocessors of the first to fifth embodiments.

Seventh Embodiment

In the explanation of the microprocessors having a built-in DRAM as the first to sixth embodiments, the data such as image data transferred from the image input section 12 is stored in the DRAM 16 and the data stored in the DRAM 16 is then transferred to the image output section 19.

In the microprocessor having a built-in DRAM of the seventh embodiment, it is possible to directly transfer data such as image data stored in the buffer 14a in the bus interface unit 14 to the buffer 18a in the bus interface unit 18 under the control of the CPU 17 or other devices, for example, as shown in FIG. 1. In the case of the microprocessor as the seventh embodiment, it is possible to further increase the data transfer speed rather than that of the microprocessors having a built-in DRAM as the first to sixth embodiments.

Eighth Embodiment

Figure 8:
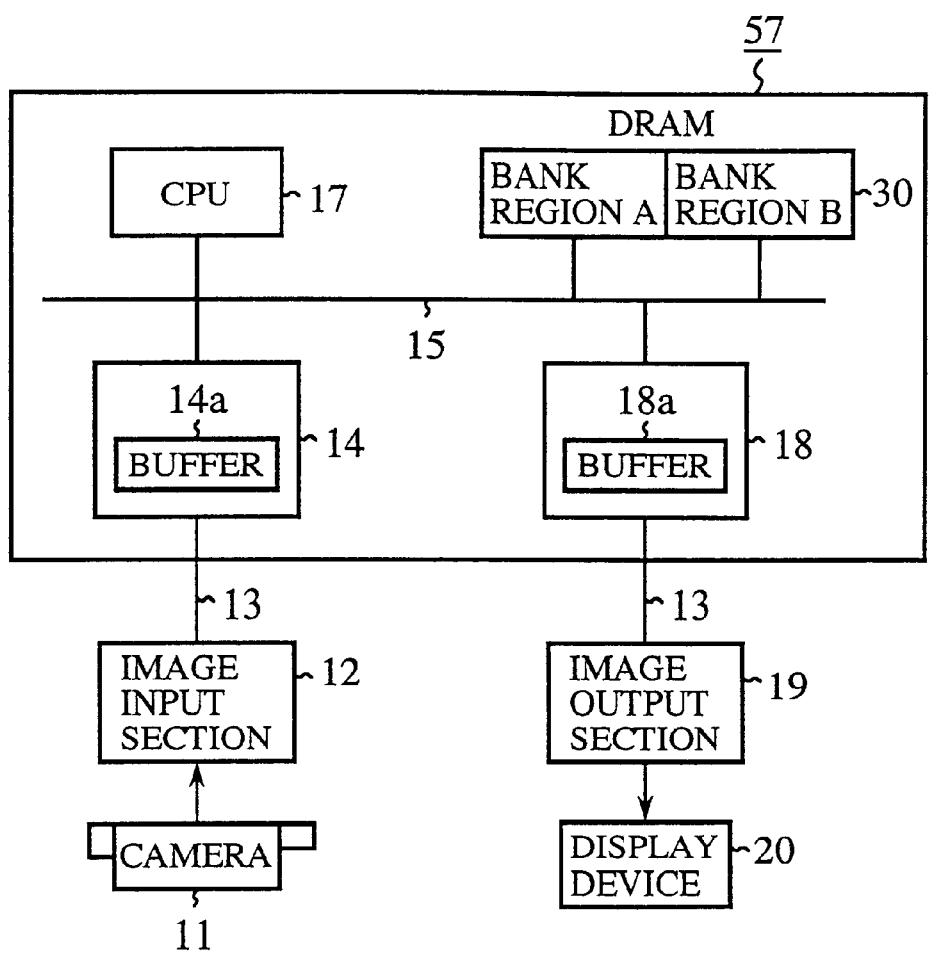
FIG. 8 is a diagram showing a configuration of a microprocessor having a built-in DRAM according to the eighth embodiment of the present invention.

FIG. 8 is a diagram showing a configuration of the microprocessor having a built-in DRAM according to the eighth embodiment of the present invention. In FIG. 8, the reference number 57 designates the microprocessor having a built-in DRAM, 30 denotes the built-in DRAM having two bank regions A and B. The same circuit components are designated with the same reference numbers of the circuit components used in the microprocessor of the first embodiment, and the explanation of them is therefore omitted here for brevity.

The DRAM 30 has a memory area which is divided into a bank region A and a bank region B. In the bank region A, the data stored in the buffer 14a in the bus interface unit 14 is stored. In the bank region B, the operation result obtained by the execution of the CPU 17 is stored.

Figure 9:
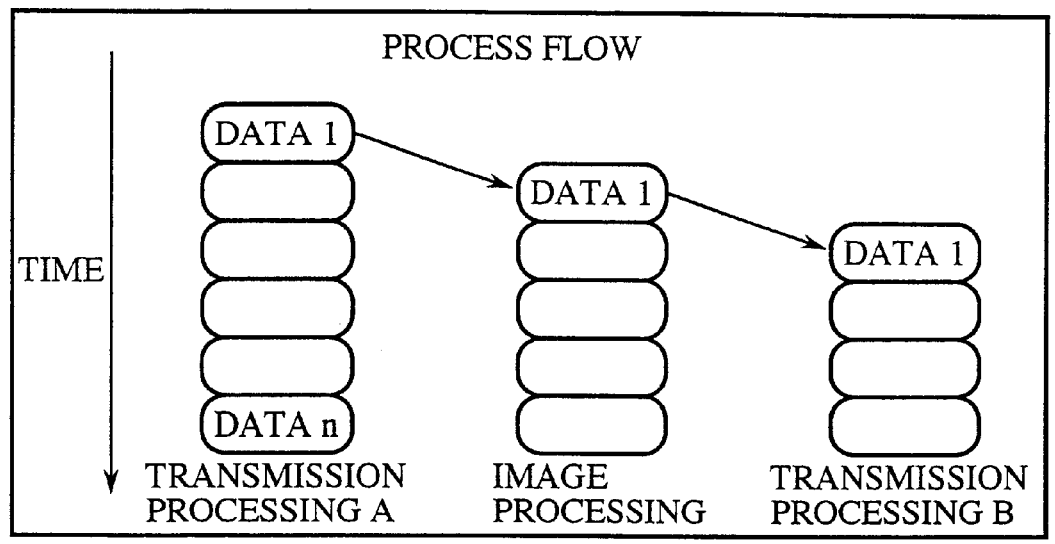
FIG. 9 is a diagram showing operation flow of the microprocessor having a built-in DRAM as the eighth embodiment shown in FIG. 8.
Figure 10:
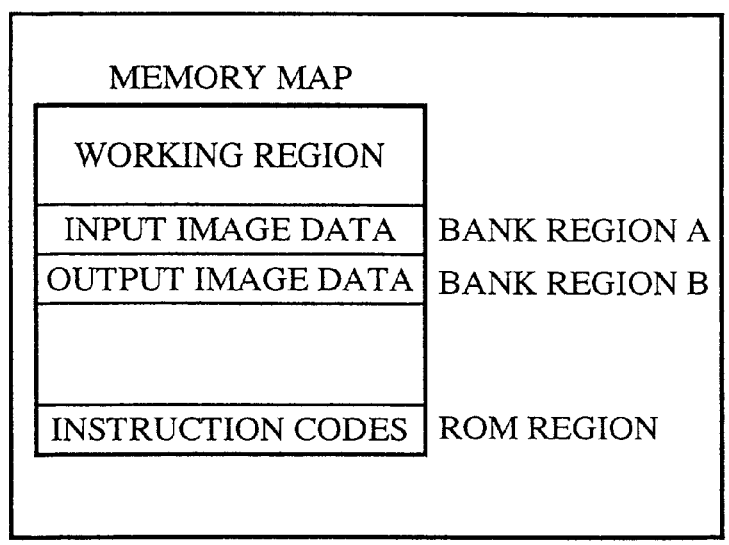
FIG. 10 is a diagram showing a memory map of the DRAM 30.

FIG. 9 is a diagram showing operation flow of the microprocessor having a built-in DRAM as the eighth embodiment shown in FIG. 8. FIG. 10 is a diagram showing one example of a memory map for the bank region A and the bank region B in the DRAM 30.

Next, a description will be given of the operation of the microprocessor having a built-in DRAM as the eighth embodiment.

In the microprocessor having a built-in DRAM as the first embodiment, after the data transfer operation to the DRAM 16 is executed (that will be referred to as a data transfer processing A), the CPU 17 performs the image processing for the data and outputs the operation result of the image processing to the image output section 19 (that will be referred to as a data transfer processing B). Thus, in the case of the first embodiment, it is difficult to execute both the data transfer processing A and the data transfer processing B simultaneously in parallel.

As shown in FIG. 8, in the microprocessor having a built-in DRAM of the eighth embodiment, because the DRAM 16 is divided into two bank regions A and B, it is possible to execute both the data accessing operations to the bank regions A and B in parallel simultaneously. Accordingly, as shown in FIG. 9, the microprocessor having a built-in DRAM of the two bank regions may perform the data transfer processing A, the image processing, and the data transfer processing B simultaneously. As a result, it is possible to increase a page hit rate of data stored in the DRAM 16 and to increase the data transfer speed.

Ninth Embodiment

In the microprocessors having a built-in DRAM of the first embodiment to the eighth embodiment, a single DRAM is incorporated in the microprocessor.

Figure 11:
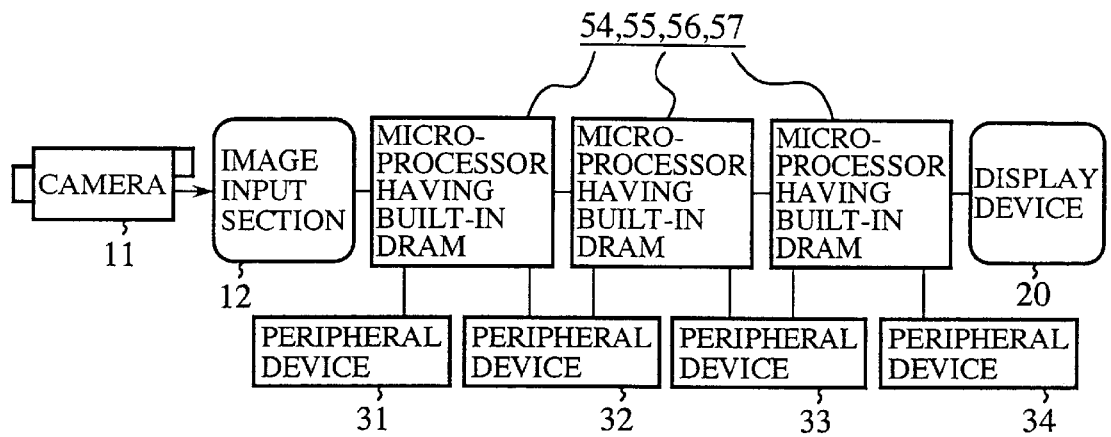
FIG. 11 is a diagram showing one example of a system configuration in which a plurality of the microprocessors, each having a built-in DRAM, as the first to eighth embodiments of the present invention are connected.
Figure 12:
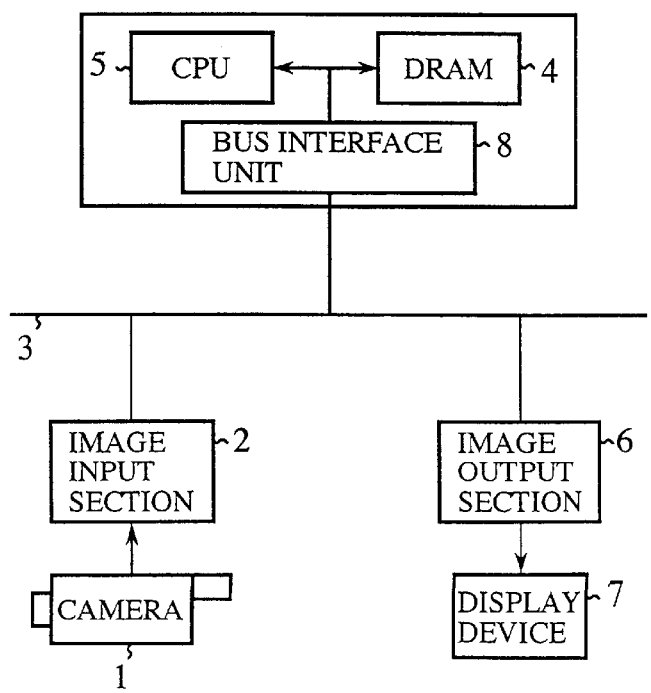
FIG. 12 is a diagram showing a configuration of a conventional microprocessor having a built-in DRAM.

FIG. 11 is a diagram showing one example of a system configuration in which a plurality of the microprocessors, each having a built-in DRAM, as the first to eighth embodiments of the present invention are connected. As shown in FIG. 11, it is possible to connect a plurality of DRAMs in order to form the system. In FIG. 11, the reference numbers 54, 55, 56, and 57 designate the microprocessors having a built-in DRAM as the first to eighth embodiments of the present invention. The reference numbers 31 to 34 denote peripheral devices such as a DMA controller and the like.

Thus, because it is possible to use a bus like the internal bus 15 for connecting among the microprocessors 54, 55, 56, and 57 when the system is constructed by connecting a plurality of the microprocessors 54, 55, 56, and 57, it is possible for the bus access operation to become a drawback of a bottle neck, so that it is possible to increase the operation speed according to the number of the microprocessors.

Because it is possible to transfer data to other microprocessor without through the DRAM 16 when the bus interface unit 18 in the microprocessor having a built-in DRAM is mapped in a memory address space, it is possible to further increase the data transfer speed.

Tenth Embodiment

In the preceding explanation for the microprocessors having a built-in DRAM of the first to eighth embodiment and for the system as the ninth embodiment of the present invention, the direction of the data transfer is not switched. That is, the bus interface unit 14 inputs data and the bus interface unit 18 outputs data.

On the contrary, in the microprocessor having a built-in DRAM as the tenth embodiment, it is possible to switch the direction of the data transfer under the control of two bus controllers for the system bus 13a that are incorporated in the microprocessor or located at outside of the microprocessor.

In the system having the microprocessors having a built-in DRAM, because peripheral devices that are a same type may be used, it is possible to realize the system that may be operable under a simple control.

As set forth, according to the present invention, because the microprocessor having a built-in DRAM has the configuration in which data stored in the buffer (as a first buffer) is transferred to the DRAM through the internal bus, whose data transfer speed is higher than that of the external data bus, the transferring occuring when the number of the data inputs performed by the input means such as the image input section reaches to a predetermined number not less than two, and because the data stored in the DRAM is read through the internal bus and then transferred to the external data path (such as the external data transfer bus), it is possible to avoid that the data transfer operation becomes a drawback of a bottle neck even if data of a larger size such as image data is processed. As a result, it is possible to increase the entire operation speed of a system.

In addition, according to the present invention, because the microprocessor having a built-in DRAM has the configuration in which data stored in the buffer (as a first buffer) is transferred to the DRAM through the internal bus whose data transfer speed is higher than that of the external bus, the transferring occurring when the number of the data inputs performed by the input means such as the image input section reaches a predetermined number not less than two, and because the data stored in the DRAM as the operation result executed by a CPU is read through the internal bus and then transferred to the external bus (such as the external data transfer path), it is possible to avoid the case that the data transfer operation becomes a drawback of a bottle neck even if data of a larger size such as image data is processed. As a result, it is possible to increase the entire operation speed of a system.

Furthermore, according to the present invention, because the microprocessor having a built-in DRAM has the configuration in which the bus width of the internal bus is not less than two times of the bus width of the external data transfer path (as the external bus), and because the access frequency to the DRAM during the data transfer may be reduced, it is possible to increase the data transfer speed.

Moreover, according to the present invention, because the microprocessor having a built-in DRAM has the configuration in which the data storing size in the buffer to which the input means stores data is equal to the data size that is transferred at a time through the internal data transfer path, it is possible to manage the data by the input means and to manage the data transfer through the data transfer means easily.

In addition, according to the present invention, because the microprocessor having a built-in DRAM has the configuration in which data may be transferred per page when the output means reads the data stored in the DRAM and then outputs the data onto the external data transfer path, it is possible to increase the data transfer speed even if data of a larger size such as image data is processed.

Furthermore, according to the present invention, because the microprocessor having a built-in DRAM has the configuration in which data read from the DRAM is converted into serial data items and then transferred serially onto the external data transfer path, it is possible to reduce the number of the I/O terminals in the microprocessor.

Moreover, according to the present invention, because the microprocessor having a built-in DRAM has the configuration in which data is also directly transferred to the output means when the data transfer means transfers the same data to the DRAM, it is possible to further increase the data transfer speed.

In addition, according to the present invention, because the microprocessor having a built-in DRAM has the configuration in which the area of the DRAM is divided into the bank region to which the data transfer means stores data and the bank region to which the processing means such as the CPU stores its operation result, it is possible to perform both the data transfer operation by the data transfer means, the data processing operation by the processing means, and the data transfer operation by the output means in parallel, so that a page hit rate may be increased and it is possible to further increase the data transfer speed.

Furthermore, according to the present invention, because the data transfer method of the microprocessor having a built-in DRAM performs the operations in which data stored in the buffer is transferred to the DRAM through the internal bus whose data transfer speed is higher than that of the external bus, the transferring occurring when the number of the data inputs performed by the input means such as the image input section reaches a predetermined number not less than two, and because the data stored in the DRAM is read through the internal bus and then transferred to the external data transfer path (such as the external bus), it is possible to avoid that the data transfer operation becomes a drawback of a bottle neck even if data of a larger size such as image data is processed. As a result, it is possible to increase the entire operation speed of a system including the microprocessor.

In addition, according to the present invention, because the data transfer method of the microprocessor having a built-in DRAM performs the operations in which data stored in the buffer is transferred to the DRAM through the internal bus whose data transfer speed is higher than that of the external bus, the transferring occurring when the number of the data inputs performed by the input means such as the image input section reaches a predetermined number not less than two, and because the data stored in the DRAM as the operation result executed by a CPU is read through the internal bus and then transferred to the external data transfer path (such as the external bus), it is possible to avoid that the data transfer operation becomes a drawback of a bottle neck even if data of a larger size such as image data is processed. As a result, it is possible to increase the entire operation speed of a system including the microprocessor.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A microprocessor for an image processing system, said microprocessor having a built-in dynamic random access memory (DRAM), comprising:

input means for inputting data at a maximum of n bits at a time through a first external system bus and for storing said data into a first buffer, said first buffer having a maximum size of n×p bits, and p is a predetermined number, n and p being natural numbers;

transfer means for transferring said data stored in said first buffer to said DRAM through an internal system bus, whose data transfer speed is higher and whose data width is wider than a data transfer speed and a data width of said first external system bus, said transferring occurring only when a) the number of data input operations performed by said input means reaches the predetermined number p not less than two and b) said first buffer is filled with said data; and output means for reading said data stored in said DRAM through said internal system bus, for writing said data into a second buffer, and for outputting said data in said second buffer to a second external system bus, wherein said first and second external system buses connected to said first buffer and said second buffer, respectively, operate independently of each other.

2. A microprocessor for an image processing system having a built-in dynamic random access memory (DRAM), said microprocessor comprising:

input means for inputting data at a maximum of n bits at a time through a first external data transfer path and for storing said data into a first buffer, said first buffer having a maximum size of n×p bits, and p is a predetermined number, n and p being natural numbers;

transfer means for transferring said data stored in said first buffer to said DRAM through an internal data transfer path, whose data transfer speed is higher and whose data width is wider than a data transfer speed and a data width of said first external data transfer path, said transferring occurring only when a) the number of data input operations performed by said input means reaches the predetermined number p not less than two and b) said first buffer is filled with said data;

processing means for processing said data stored in said DRAM and for storing an operation result into said DRAM; and output means for reading said operation result stored in said DRAM through said internal data transfer path, for writing said operation result into a second buffer, and for outputting said operation result stored in said second buffer to a second external data transfer path, wherein said first and second external data transfer paths connected to said first buffer and said second buffer, respectively, operate independently of each other.

3. A microprocessor having a built-in DRAM as claimed in claim 1, wherein said internal data transfer path has a bus width that is at least double a bus width of said first and second external data transfer paths.

4. A microprocessor having a built-in DRAM as claimed in claim 2, wherein said internal data transfer path has a bus width that is at least double a bus width of said first and second external data transfer paths.

5. A microprocessor having a built-in DRAM as claimed in claim 1, wherein a data storing size of said first buffer to which said input means stores said data is equal to or an integer multiple of a data size that is transferred at one time through said internal data transfer path.

6. A microprocessor having a built-in DRAM as claimed in claim 2, wherein a data storing size of said first buffer to which said input means stores said data is equal to or an integer multiple of a data size that is transferred at one time through said internal data transfer path.

7. A microprocessor having a built-in DRAM as claimed in claim 3, wherein a data storing size of said first buffer to which said input means stores said data is equal to or an integer multiple of a data size that is transferred at one time through said internal data transfer path.

8. A microprocessor having a built-in DRAM as claimed in claim 4, wherein a data storing size of said first buffer to which said input means stores said data is equal to or an integer multiple of a data size that is transferred at one time through said internal data transfer path.

9. A microprocessor having a built-in DRAM as claimed in claim 1, wherein said output means performs a data accessing based on a page access mode to access data on a per page basis when said output means reads said data stored in said DRAM and outputs said data to said second external data transfer path.

10. A microprocessor having a built-in DRAM as claimed in claim 2, wherein said output means performs a data accessing based on a page access mode to access on a per page basis when said output means reads said data stored in said DRAM and outputs said data to said second external data transfer path.

11. A microprocessor having a built-in DRAM as claimed in claim 1, wherein said output means reads said data stored in said DRAM, converts said data into serial data items, and outputs said serial data items serially to said second external data transfer path.

12. A microprocessor having a built-in DRAM as claimed in claim 2, wherein said output means reads said data stored in said DRAM, converts said data into serial data items, and outputs said serial data items serially to said second external data transfer path.

13. A microprocessor having a built-in DRAM as claimed in claim 1, wherein said data transfer means also transfers said data to said output means directly when said data transfer means transfers said same data to said DRAM.

14. A microprocessor having a built-in DRAM as claimed in claim 2, wherein said data transfer means also transfers said data to said output means directly when said data transfer means transfers said same data to said DRAM.

15. A microprocessor having a built-in DRAM as claimed in claim 2, wherein a memory area of said DRAM is divided into a bank region into which said data transfer means stores said data and a bank region into which said CPU stores operation result.

16. A data transfer method of a microprocessor for an image processing system, said microprocessor having a built-in dynamic random access memory (DRAM), the data transfer method comprises the steps of:

inputting data at a maximum of n bits at a time through a first external data transfer path;

storing said data into a first buffer, said first buffer having a maximum size of n×p bits, and p is a predetermined number, n and p being natural numbers;

transferring said data stored in said first buffer to said DRAM through an internal data transfer path, whose data transfer speed is higher and whose bus width is wider than a data transfer speed and a data width of said external data transfer path, said transferring occurring only when a) the number of data input operations through said first external data transfer path reaches the predetermined number p not less than two and b) said first buffer is filled with said data;

reading said data stored in said DRAM through said internal data transfer path;

writing said data into a second buffer; and outputting said data stored in said second buffer to a second external data transfer path that operates independently from said first external transfer path connected to said first buffer.

17. A data transfer method of a microprocessor having a built-in DRAM as claimed in claim 16, which further comprises the steps of:

processing said data stored in said DRAM;

storing operation result of said processing into said DRAM;

reading said operation result stored in said DRAM through said internal data transfer path;

writing said operation result into a second buffer; and outputting said operation result stored in said second buffer to said second external data transfer path.

* * * * *